(12) United States Patent
Mittelholzer et al.

(10) Patent No.: US 9,202,580 B2
(45) Date of Patent: Dec. 1, 2015

(54) LEVEL-ESTIMATION IN MULTI-LEVEL CELL MEMORY

(71) Applicant: GlobalFoundries U.S. 2 LLC, Hopewell Junction, NY (US)

(72) Inventors: Thomas Mittelholzer, Zurich (CH); Nikolaos Papandreou, Thalwil (CH); Charalampos Pozidis, Thalwil (CH)

(73) Assignee: GlobalFoundries Inc., Grand Cayman (KY)

( * ) Notice: Subject to any disclaimer, the term of this patent is extended or adjusted under 35 U.S.C. 154(b) by 37 days.

(21) Appl. No.: 14/164,687

(22) Filed: Jan. 27, 2014

(65) Prior Publication Data

US 2014/0211564 A1     Jul. 31, 2014

(30) Foreign Application Priority Data

Jan. 30, 2013  (EP) ...................................... 1301623

(51) Int. Cl.
| | | |
|---|---|---|
| *G11C 11/34* | (2006.01) | |
| *G11C 16/26* | (2006.01) | |
| *G11C 13/00* | (2006.01) | |
| *G11C 7/10* | (2006.01) | |
| *G11C 11/56* | (2006.01) | |

(52) U.S. Cl.
CPC ............... *G11C 16/26* (2013.01); *G11C 7/1006* (2013.01); *G11C 11/5678* (2013.01); *G11C 13/0004* (2013.01); *G11C 13/004* (2013.01); *G11C 2013/0054* (2013.01)

(58) Field of Classification Search
USPC ............... 365/185.03, 185.09, 185.18, 185.2, 365/185.33
See application file for complete search history.

(56) References Cited

U.S. PATENT DOCUMENTS

| | | | |
|---|---|---|---|
| 8,644,099 B2 * | 2/2014 | Cometti et al. .......... | 365/185.18 |
| 8,793,556 B1 * | 7/2014 | Northcott et al. ........ | 365/185.29 |
| 8,972,775 B2 * | 3/2015 | Kim et al. ................ | 365/185.09 |
| 8,990,668 B2 * | 3/2015 | Krishnan et al. ......... | 365/185.33 |

* cited by examiner

*Primary Examiner* — Trong Phan

(57) ABSTRACT

The memory cells storing a group of codewords are read to obtain respective read signals each comprising N signal components corresponding to respective symbols of a codeword. The components of each read signal are ordered according to signal level to produce an ordered read signal. Correspondingly-positioned components of the ordered read signals are then ordered according to signal level to produce ordered component sets for respective component positions in a said ordered read signal. Each ordered component set is partitioned into subsets corresponding to respective memory cell levels, wherein the subsets of the ordered component sets contain respective numbers of components dependent on predefined probabilities of occurrence of different symbol values at different positions in a said codeword whose symbols are ordered according to symbol value. The reference signal level is determined in dependence on the signal components in the subsets corresponding to that memory cell level.

10 Claims, 5 Drawing Sheets

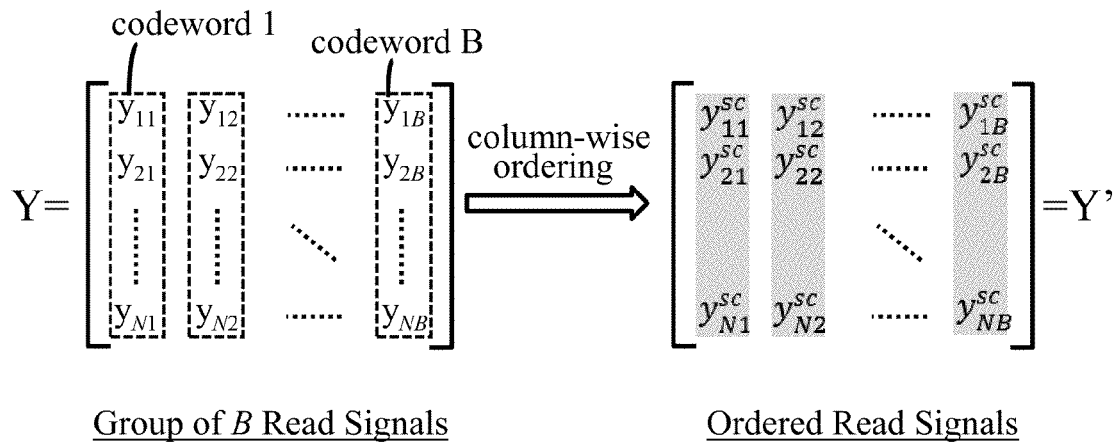
Figure 3a
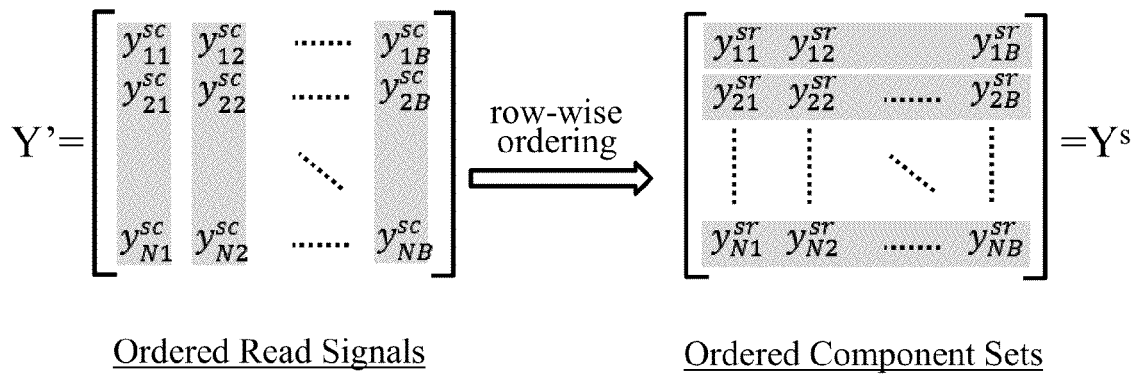
Figure 3b
| $c^{(j)}$ initial vectors | # $\Pi(c^{(j)})$ |
|---|---|
| $c^{(1)}$ = [ 0 1 1 2 2 3 3 ] | 630 |
| $c^{(2)}$ = [ 0 0 1 1 2 2 3 ] | 630 |
| $c^{(3)}$ = [ 0 0 0 1 2 3 3 ] | 420 |
| $c^{(4)}$ = [ 0 0 1 2 3 3 3 ] | 420 |
Figure 5

*Figure. 4*

PARTITIONED ORDERED COMPONENT SETS $$Y^S = \begin{bmatrix} y^{Sr}_{11}, y^{Sr}_{12}, \ldots & y^{Sr}_{1a}, \ldots & \ldots y^{Sr}_{1B} \\ y^{Sr}_{21}, y^{Sr}_{22}, \ldots & y^{Sr}_{2b}, \ldots & y^{Sr}_{2c}, \ldots & y^{Sr}_{2B} \\ y^{Sr}_{31}, y^{Sr}_{32}, \ldots & y^{Sr}_{3d}, \ldots & y^{Sr}_{3e}, \ldots & y^{Sr}_{3B} \\ y^{Sr}_{41}, \ldots & y^{Sr}_{4f}, \ldots & y^{Sr}_{4g}, \ldots & y^{Sr}_{4B} \\ \vdots \\ y^{Sr}_{N1}, \ldots & y^{Sr}_{Nh}, \ldots & y^{Sr}_{NB} \end{bmatrix}$$

PROBABILITY MATRIX $$P = \begin{bmatrix} 0.8999 & 0.0962 & 0.0039 & 0.0000 \\ 0.6329 & 0.3319 & 0.0348 & 0.0004 \\ 0.3215 & 0.5340 & 0.1403 & 0.0042 \\ 0.1138 & 0.5229 & 0.3360 & 0.0273 \\ \vdots \\ 0.0000 & 0.0039 & 0.0962 & 0.8999 \end{bmatrix}$$

| B | N | Complexity Ratio | Complexity Reduction |
|---|---|---|---|
| 16 | 8 | 4/7 | 42.9% |
| 32 | 8 | 5/8 | 37.5% |
| 1024 | 8 | 10/13 | 23.1% |

LEVEL-ESTIMATION IN MULTI-LEVEL CELL MEMORY

BACKGROUND

1. Technical Field

This invention relates generally to level-estimation in multi-level cell memory, and more particularly to methods and apparatus for determining reference signal levels corresponding to respective levels of multi-level memory cells. These reference signal levels provide the basis for detecting stored codewords in memory read operations.

2. Description of the Related Art

In multi-level cell (MLC) memory, the fundamental storage unit (the "cell") can be set to q>2 different states, or "levels", permitting storage of more than one bit per memory cell. Detection of stored data relies on identifying the different cell levels on readback. In solid-state memory such as flash memory and phase change memory (PCM), for example, the different cell levels exhibit different electrical resistance characteristics which can be detected via current or voltage measurements on the cells. When writing information in MLC memory, each cell can be used to store a $q^{ary}$ symbol with each of the q possible symbol values being represented by a different cell level. On readout of multi-level cells, the read signal level is compared with a set of reference signal levels indicative of the q cell levels in order to determine which level each cell is set to and thus detect the stored symbol value.

SUMMARY

One embodiment of an aspect of the present invention provides a method for determining reference signal levels corresponding to respective levels of q-level memory cells, the cells storing respective symbols, each of which has one of q symbol values, of N-symbol codewords of a predefined codeword set, where q>2. The method comprises:

reading the memory cells storing a group of codewords to obtain respective read signals each comprising N signal components corresponding to respective symbols of a codeword;

ordering the components of each read signal according to signal level to produce an ordered read signal;

ordering correspondingly-positioned components of the ordered read signals according to signal level to produce ordered component sets for respective component positions in a said ordered read signal;

partitioning each ordered component set into subsets corresponding to respective memory cell levels, wherein the subsets of the ordered component sets contain respective numbers of components dependent on predefined probabilities of occurrence of different symbol values at different positions in a said codeword whose symbols are ordered according to symbol value; and determining the reference signal level corresponding to a respective memory cell level in dependence on the signal components in the subsets corresponding to that memory cell level.

Methods embodying this invention provide for level-estimation in MLC memory storing length-N, $q^{ary}$-symbol codewords whose symbols are stored in respective q-level memory cells. A plurality of stored codewords are read at a time, and the resulting read signals for this group of codewords are processed to determine current reference signal levels for respective levels of the q-level memory cells. Like the technique of our international patent application referenced above, the components of each read signal are first ordered according to signal level (e.g. in order of increasing signal level) to produce an ordered read signal. However, a further ordering process is then performed for correspondingly-positioned components of the ordered read signals, i.e. components at equivalent positions in the N-component sequences of the ordered read signals. Each of the resulting ordered component sets is then partitioned into subsets corresponding to respective memory cell levels. The size (i.e. number of components) of each of these subsets depends on predetermined probabilities of occurrence of different symbol values at different symbol positions in a codeword of the overall codeword set whose symbols have been ordered according to symbol value. The signal components in subsets corresponding to a given memory cell level can then be used to determined the current reference signal level for that cell level. This process is self-adaptive, using read signals from actual "user cells" (the cells storing encoded user data) to determine reference levels for those cells. Problems associated with use of training data from reference cells are therefore avoided. Moreover, methods embodying the invention combine the universally good performance of the technique of our above-referenced UK patent application with the low latency and low complexity of the technique described in our international patent application. Embodiments of the invention thus offer simple, high-speed decoder implementation with good estimation performance even for very small data records. With these combined qualities, use of MLC memory in main/hybrid memory applications, with significant resulting benefit to the memory hierarchy, becomes eminently feasible.

The N symbols of each codeword may comprise modulation-coded user data or simply user data expressed in a $q^{ary}$ alphabet and not otherwise subject to encoding. The overall codeword set comprises the set of such codewords employed in operation of the system.

A said ordered component set is preferably produced for each of the N component positions of an ordered read signal. Each of these can then be partitioned into up to q subsets each of which corresponds to a respective one of the q memory cell levels. The reference signal level for each of the q memory cell levels can then be determined based on the signal components in the resulting subsets corresponding to that memory cell level. Alternative embodiments can be envisaged, however, as will be discussed further below.

The reference signal level corresponding to a respective memory cell level may be determined by calculating an average value of the signal components in the subsets corresponding to that memory cell level. The average value here is preferably a mean value.

The reference signal levels determined from the read signals for a group of stored codewords can then be used to detect those codewords from the read signals. Thus, an embodiment of a second aspect of the invention provides a method for detecting N-symbol codewords of a predefined codeword set, the symbols of each codeword, each of which has one of q symbol values, being stored in respective q-level memory cells, where q>2. The method comprises:

performing a method according to the first aspect of the invention to determine reference signal levels for respective memory cell levels from the read signals for a group of codewords; and detecting the codeword corresponding to each of said read signals in dependence on said reference signal levels.

An embodiment of a third aspect of the invention provides apparatus for determining reference signal levels corresponding to respective levels of q-level memory cells, the cells storing respective symbols, each of which has one of q symbol values, of N-symbol codewords of a predefined codeword set, where q>2. The apparatus comprises a memory controller for reading the memory cells storing a group of codewords to obtain respective read signals each comprising N signal components corresponding to respective symbols of a codeword, and a level estimator comprising control logic adapted to:

order the components of each read signal according to signal level to produce an ordered read signal;

order correspondingly-positioned components of the ordered read signals according to signal level to produce ordered component sets for respective component positions in a said ordered read signal;

partition each ordered component set into subsets corresponding to respective memory cell levels, wherein the subsets of the ordered component sets contain respective numbers of components dependent on predefined probabilities of occurrence of different symbol values at different positions in a said codeword whose symbols are ordered according to symbol value; and determine the reference signal level corresponding to a respective memory cell level in dependence on the signal components in the subsets corresponding to that memory cell level.

An embodiment of a fourth aspect of the invention provides a data storage device comprising:

memory having q-level memory cells, where q>2;

write apparatus for writing in the memory N-symbol codewords of a predefined codeword set, the symbols of each codeword, each of which has one of q symbol values, being stored in respective memory cells; and read apparatus comprising apparatus according to the third aspect of the invention for determining reference signal levels for respective memory cell levels from said read signals for a group of codewords, and a codeword detector for detecting the codeword corresponding to each of said read signals in dependence on said reference signal levels.

In general, where features are described herein with reference to a method embodying the invention, corresponding features may be provided in apparatus embodying the invention, and vice versa.

BRIEF DESCRIPTION OF THE SEVERAL VIEWS OF THE DRAWINGS

Preferred embodiments of the invention will now be described, by way of example, with reference to the accompanying drawings in which:

FIGS. 3a and 3b illustrate respective ordering steps of the FIG. 2 process;

FIG. 4 illustrates partitioning of ordered component sets in the FIG. 2 process;

FIG. 5 indicates construction of an exemplary code for use in the FIG. 1 device;

DETAILED DESCRIPTION

Figure 1:
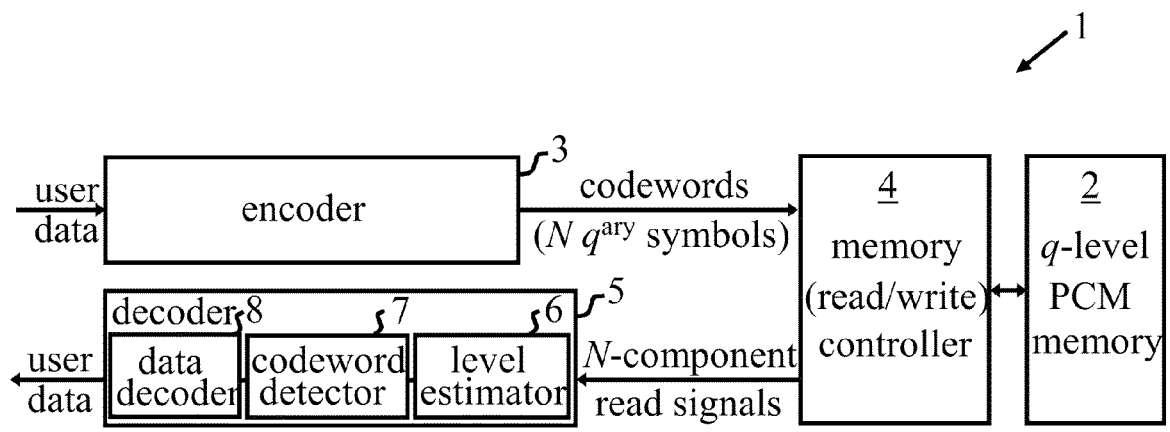
FIG. 1 is a schematic block diagram of a data storage device embodying the invention.

A problem in MLC memory is that the physical quantity measured during cell readout is subject to variability, e.g. due to drift in measured values with time or cell usage. For example, the electrical resistance of PCM cells drifts upwards with time in a stochastic manner. This drift can be data-dependent, i.e. may vary for different cell levels. As another example, the physical quantity measured in flash memory cells is the transistor's threshold voltage and this drifts upwards as a function of the number of write/erase cycles the cell is subjected to. Cell readout can also be hampered by noise, causing further variation in read signal levels. For any given stored symbol value and hence cell level, therefore, the actual read signal level obtained on cell-readout is variable.

Level variability is a problem for multi-level storage in that it compromises reliability. The readback values of neighboring levels may interfere with one another, e.g. due to upward drift of the lower level towards the upper level over time, causing detection errors. The closer the initial spacing between levels, the more susceptible they are to this problem. Hence, packing higher numbers of levels per memory cell becomes more difficult due to the increased likelihood of error during detection. On the other hand, packing more bits per cell is a crucial requirement for all memory technologies, being the best known way of reducing manufacturing cost per bit. In situations like this where the read signal level distributions for cell levels are varying, the reference signal levels used for level detection need to be varied accordingly. Reliable estimation of the reference signal levels is crucial to reliable readback performance.

One approach to the above problem uses training data derived from a pool of reference memory cells for estimation of reference signal levels. Known information is written to these reference cells each time a block of user data is written to memory. The reference cells are then read whenever the user file is read, and the reference cell readings are used to derive estimates for the changing reference signal levels used for detection. Reference cell based techniques inherently introduce overhead as the reference cells cannot be used to store user data. There are also penalties in terms of controller complexity and latency due to the need for readout of reference cells in tandem with a user data block, as well as other issues, e.g. wear-levelling issues, related to management of the pool of reference cells. Moreover, since drift is a statistical phenomenon and there is significant variability between cells in a memory array, reference cells may not be representative and the effectiveness of this approach may vary substantially with time and over different portions of the memory array.

Another approach is described in our copending International Patent Application no. PCT/IB2012/053237, filed 27 Jun. 2012. This discloses a drift-resistant technique for read-detection of permutation-based codes in multi-level memory. The codes in question are length-N, $q^{ary}$-symbol codes, whereby each codeword has N symbols and each symbol can take one of q symbol values. Each symbol is recorded in a respective q-level cell by setting the cell to a level dependent on the $q^{ary}$ symbol value. The detection system exploits the property of permutation-based codes that all codewords are permutations of a known set of N-symbol vectors, e.g. the so-called "initial vectors" for a union of permutation codes. Memory cells are read in batches to obtain read signals corresponding to a group of codewords. Each read signal has N signal components corresponding to respective symbols of a codeword, and these components are ordered according to signal level to obtain an ordered read signal for each codeword. Components of these ordered read signals are related to symbols of the known set of initial vectors via a process which involves averaging ordered read signals and relating the averaged signal components to symbol values using predefined probabilities of occurrence of different symbol values at different symbol positions as derived from the initial vectors. This reduces the problem of finding the q drifted reference signal levels to the problem of solving an over-determined system of N linear equations for the q unknown reference levels. In this way, estimates are obtained for the reference signal levels for the q-level cells in the current batch, and these reference levels are then used in codeword detection for the batch. Unlike the training-data approach, this is a self-adaptive technique which uses the actual cells storing encoded user data to estimate the reference levels for those cells on readback, thereby accounting for level variability on a dynamic basis.

Another self-adaptive level-estimation technique is described in our copending UK Patent Application no. 1203496.3, filed 29 Feb. 2012. This technique again permits detection of length-N, $q^{ary}$-symbol codewords whose symbols are stored in respective q-level memory cells. As before, memory cells are read in batches to obtain read signals corresponding to a group of B codewords, where each read signal has N signal components corresponding to respective symbols of a codeword. In this case, however, the signal components of the entire group of read signals are ordered according to signal value. The resulting ordered component sequence is then partitioned to obtain a plurality of segments each corresponding to a different memory cell level. The size (i.e. number of components) of each of these segments is determined based on predetermined frequency data indicative of expected frequency of occurrence of the corresponding level in use of the code. The signal components in these segments can then be used to obtain the set of q current reference signal levels.

FIG. 1 is a simplified schematic of a solid-state storage device, here a phase-change memory (PCM) device 1, embodying the invention. The device 1 includes phase-change memory 2 for storing data in one or more integrated arrays of multilevel PCM cells. Though shown as a single block in the figure, in general memory 2 may comprise any desired configuration of PCM storage units ranging, for example, from a single chip or die to a plurality of storage banks each containing multiple packages of storage chips. Write apparatus of device 1 comprises an encoder 3 for encoding input user data as discussed below and a memory controller 4 which controls writing of the resulting codewords in memory 2. The device read apparatus also involves memory controller 4 for reading the appropriate cells in memory 2, and a decoder 5 for processing the resulting read signals. Decoder 5 comprises a level estimator 6 for determining reference signal levels corresponding to the q memory cell levels, and a codeword detector 8 which detects codewords corresponding to the received read signals. Decoder 5 further includes a data decoder 8 for decoding the detected codewords to recover the original user data.

Each of the PCM cells in memory 2 can be set to one of q>2 nominal levels designated $l_1$ to $l_q$ herein. Read/write controller 4 can set a cell to a particular level by adjusting the resistance of the cell in known manner. To read a cell, controller 4 applies a small probing signal to obtain a readback signal indicative of the cell's resistance. During write and read operations, controller 4 addresses individual cells in known manner by applying appropriate voltage signals to an array of word and bit lines in memory ensemble 2.

In operation of device 1, the input user data to be recorded in memory 2 is supplied to encoder 3. The encoder 3 encodes the input data into codewords of a predetermined set of length-N, $q^{ary}$-symbol codewords, where in general N≥q. Hence, each codeword has N symbols $s_n$, n=1, 2, ..., N, and each symbol can take one of q possible values. Any length-N, $q^{ary}$-symbol code can be employed in encoder 3. In general, the encoding process may involve modulation coding of input data or simple mapping of binary input data into $q^{ary}$ symbols without further encoding of the user data. The q possible symbol values correspond to respective predetermined levels $l_1$ to $l_q$ of the q-level cells in memory 2. Controller 4 stores the N symbols of each codeword output by encoder 3 in respective cells of memory 2 by setting each cell to a level dependent on the symbol value to be stored in accordance with the predefined correspondence between symbol values and cell levels. (Note that, when setting a cell to a given level, the actual resistance value x assumed by the cell may lie within a small interval around the nominal resistance value l for the level due to write noise).

Blocks of codewords are written/read substantially simultaneously to memory by memory controller 4. In this embodiment, controller 4 writes/reads groups of B codewords in parallel so that the codewords in each group are written/read at the same time instants. In a read operation, the memory cells storing a group of B codewords are read to obtain B real-valued read signals y each having N signal components $y_n$, n=1, 2, ..., N, indicating the readback resistance values of the sequence of cells storing the N symbols of a codeword. The signal components $y_1, \ldots y_N$ of each read signal thus correspond to respective symbols of a codeword. The group of read signals y is supplied to decoder module 5. Level estimator 6 of the decoder 5 processes the read signals to determine a current set of reference signal levels for the q memory cell levels by a process detailed below. Codeword detector 7 then detects codewords corresponding to the group of read signals based on the reference levels determined by level estimator 6. Data decoder 8 decodes the detected codewords by performing the inverse of the encoding performed in encoder 3, thus recovering the original input data.

In general, functionality of encoder 3 and decoder 5 could be implemented in hardware, software or a combination thereof. For example, the mapping of input data words into codewords in encoder 3 may be implemented using a look-up table, in particular for small codes, or using the well-known technique of enumerative source coding for more efficient operation with large codes. Data decoder 8 can be implemented in corresponding manner to perform the inverse of the coding process. The level estimator 6 comprises control logic for implementing the various steps of the level estimation process detailed below, and this control logic can be embodied in hardware or software or a combination of hardware and software components. For example, one or more steps could be performed in whole or in part by software which configures a processor to implement the functionality described, and suitable software will be readily apparent to those skilled in the art. For reasons of operating speed, however, the use of hardwired logic circuits is generally preferred to implement level estimator functionality. Again, suitable implementations will be readily apparent from the description of operation herein.

In read operations from memory 2, the readback resistance levels corresponding to respective symbol values of the stored codewords are variable due to drift and noise effects. The readback resistance level distributions shift in time, with changing means and potentially variances, and are level-dependent, having data-dependent means and variances. Accurate detection of codewords from the codeword read signals y must account for this variation in the resistance level distributions. Most fundamentally, for accurate correlation of read signal components $y_n$ with symbol values $s_n$ on readback, the level estimator 6 must estimate appropriate reference signal levels which correspond to the different cell levels $l_1$ to $l_q$, and hence to the different symbol values, for the read operation. These estimated reference signal levels can then be used for codeword detection. An overview of the level estimation process is given below with reference to the flow diagram of FIG. 2.

Figure 2:
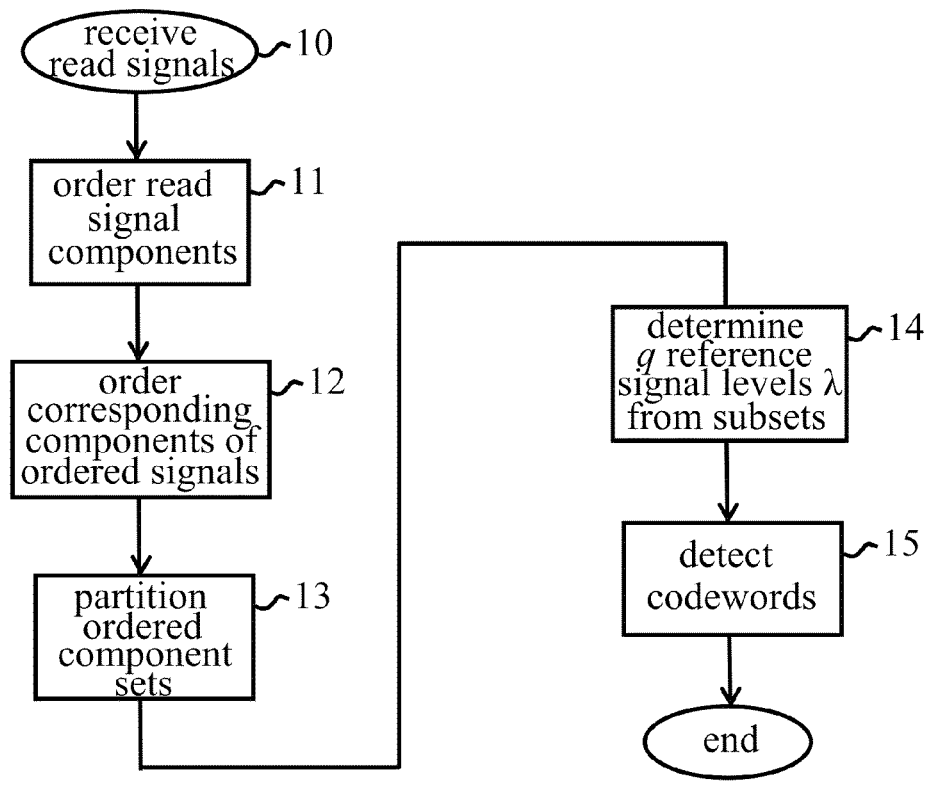
FIG. 2 indicates key steps of a level estimation process in the FIG. 1 device.

FIG. 2 indicates the main operational steps performed for detection of codewords on readback. As indicated at step 10, operation commences on receipt by level estimator 6 of a group of B read signals y corresponding to a group of B codewords read from memory 2. The read signals y are temporarily stored in codeword detector 6 for use in the subsequent processing operation. Next, in step 11, the control logic of level estimator 6 orders the components $y_1$ to $y_N$ of each read signal y according to signal level. In particular, the read signal components are ordered in order of increasing signal level to produce a group of B ordered read signals $y_i^{sc}$:

$$y_i^{sc}=[y_{1i}^{sc},y_{2i}^{sc},\ldots y_{Ni}^{sc}], y_{1i}^{sc} \leq y_{2i}^{sc} \leq \ldots y_{Ni}^{sc}, \text{where}$$
$$i=1,\ldots,B$$

In step 12, the level estimator 6 then orders correspondingly-positioned components of the ordered read signals $y_i^{sc}$ according to signal level to produce ordered component sets for respective component positions, where the ordering process is again performed in order of increasing signal level in this example. That is, the B components $y_{n1}^{sc}, y_{n2}^{sc}, \ldots y_{nB}^{sc}$ of the ordered read signals at each component position n=1, ..., N thereof are ordered to produce N ordered component sets:

$$y_n^{sr}=[y_{n1}^{sr},y_{n2}^{sr},\ldots y_{nB}^{sr}], y_{n1}^{sr} \leq y_{n2}^{sr} \leq \ldots y_{nB}^{sr},$$
$$\text{where } n=1,\ldots,N.$$

Next, in step 13, the level estimator partitions each of these ordered component sets into subsets corresponding to respective memory cell levels. These subsets contain respective numbers of components which depend on predefined probabilities of occurrence of different symbol values at different positions in a codeword whose symbols are ordered according to symbol value. This is explained in more detail below. In step 14, the level estimator logic determines a current reference signal level for each of the q memory cell levels in dependence on the signal components in the subsets corresponding to that memory cell level. In particular, for the q nominal cell levels $l_1$ to $l_q$ at time t=0, the corresponding drifted levels for the current batch of codewords are denoted by $\lambda_1$ to $\lambda_q$. These current reference signal levels $\lambda_1$ to $\lambda_q$ are calculated in level estimator 6 via a process detailed below. The resulting set of reference levels $\lambda_1$ to $\lambda_q$ is then supplied by level estimator 6 to codeword detector 7. In step 15 of FIG. 2, the codeword detector 7 uses the current reference levels $\lambda_1$ to $\lambda_q$ to detect the codewords corresponding to the current group of B read signals. This can be done in various ways as discussed further below. The codeword detection operation is then complete.

The operation of steps 11 to 14 of the FIG. 2 process will now be explained in more detail. The sorting operations of steps 11 and 12 are readily understood by considering the group of B read signals y as column vectors of a (N×B)-component matrix. This matric Y is illustrated on the left-hand side of FIG. 3a. Thus, components $y_{11}, y_{21}, \ldots, y_{N1}$ of the first read signal, corresponding to the first of the group of B stored codewords, form the first column of the matrix Y. The components of the second and subsequent read signals then form the second, third, fourth, etc., columns up to the $B^{th}$ read signal in the final column of the matrix, depicted as $[y_{12}, y_{22}, \ldots, y_{N2}] \ldots [y_{1B}, y_{2B}, \ldots, y_{NB}]$. The sorting operation of step 11 of FIG. 2 involves column-wise ordering of the matrix Y. Hence, the components within each individual column of matrix Y are ordered in increasing order of signal level to produce the matrix Y' shown on the right of FIG. 3a, where the shading indicates ordering direction. The column vectors of this matrix correspond to the ordered read signals $y_i^{sc} = [y_{1i}^{sc}, y_{2i}^{sc}, \ldots y_{Ni}^{sc}]$, i=1, ..., B. The matrix is depicted as $[[y_{11}^{SC}, y_{21}^{SC}, \ldots, y_{N1}^{SC}][y_{12}^{SC}, y_{22}^{SC}, \ldots, y_{N2}^{SC}] \ldots [y_{1B}^{SC}, y_{2B}^{SC}, \ldots, y_{NB}^{SC}]]=Y'$ The sorting operation of step 12 of FIG. 2 involves row-wise ordering of the matrix Y'. This is illustrated in FIG. 3B where Y' is depicted on the left side as $[[y_{11}^{SC}, y_{21}^{SC}, \ldots, y_{N1}^{SC}][y_{12}^{SC}, y_{22}^{SC}, \ldots, y_{N2}^{SC}] \ldots [y_{1B}^{SC}, y_{2B}^{SC}, \ldots, y_{NB}^{SC}]]$. The B components in each row of matrix Y' are thus ordered in increasing order of signal level to produce the final, sorted matrix $Y^s$ shown on the right of FIG. 3b, where the shading again indicates ordering direction. The row vectors of this matrix $Y^s$ correspond to the ordered component sets $y_n^{sr} = [y_{n1}^{sr}, y_{n2}^{sr}, \ldots y_{nB}^{sr}]$, n=1, ..., N. The matrix $Y^S$ is depicted on the right side in FIG. 3B as $[[y_{11}^{Sr}, y_{12}^{Sr}, \ldots, y_{1B}^{Sr}][y_{21}^{Sr}, y_{22}^{Sr}, \ldots, y_{2B}^{Sr}] \ldots [y_{N1}^{Sr}, y_{N2}^{Sr}, \ldots, y_{NB}^{Sr}]]$ The partitioning of ordered component sets in step 13 of FIG. 2 is illustrated in FIG. 4 in relation to matrix $Y^s$ which is depicted on the left side in FIG. 4 as $[[y_{11}^{Sr}, y_{12}^{Sr}, \ldots y_{1a}^{Sr}, \ldots, y_{1B}^{Sr}][y_{21}^{Sr}, y_{22}^{Sr}, \ldots y_{2b}^{Sr}, \ldots y_{2c}^{Sr}, \ldots, y_{2B}^{Sr}][y_{31}^{Sr}, y_{32}^{Sr}, \ldots y_{3d}^{Sr} \ldots y_{3e}^{Sr}, \ldots, y_{3B}^{Sr}][y_{41}^{Sr}, \ldots y_{4f}^{Sr} \ldots y_{4g}^{Sr}, \ldots, y_{4B}^{Sr}] \ldots [y_{N1}^{Sr}, y_{Nh}^{Sr}, \ldots, y_{NB}^{Sr}]]$. Each ordered component set, i.e. each row vector of $Y^s$, is partitioned into subsets as indicated by the shaded rectangles in $Y^s$ in the figure. The size, i.e. number of constituent components, of these subsets is determined from a set of probabilities which are predefined in level estimator 6 based on the particular codeword set C employed in encoder 3. These specify the probabilities of occurrence of each possible symbol value at each symbol position in a codeword whose symbols are ordered according to symbol value. For example, considering the ordered codeword set $C^o$, in which all codewords $X=[X_1, X_2, \ldots, X_N] \in C$ have been replaced by their ordered versions $X^o$:

$$X^o=[X_{k1},X_{k2},\ldots,X_{kN}] \text{ with } X_{k1} \leq X_{k2} \leq \ldots \leq X_{kN}$$

the stochastic (N×q)-matrix $P=[p_{nm}]$ can be defined as: $p_{nm}=\text{prob } \{X^o_n=S_m\}$. Matrix P is depicted with some example probability values, e.g., 0.8999, 0.6329, 0.3215, 0.1138, . . . 0.0000 in column $l_1$; 0.0962, 0.3319, 0.5340, 0.5229, . . . 0.0039 in column $l_2$; 0.0039, 0.0348, 0.1403, 0.3360, . . . 0.0962 in column $l_3$; and 0.0000, 0.0004, 0.0042, 0.0273, . . . 0.8999 in column $l_4$.

where n=1 to N, m=0 to q−1, and $S_1, S_2, \ldots, S_{q-1}$ are the symbol values 0, 1, . . . , q−1 respectively. Such a matrix can be defined for any code C based on the known code structure, i.e. the particular codewords in the codeword set.

An exemplary probability matrix P is shown on the right-hand side of FIG. 4. This indicates probabilities of occurrence of the symbol values corresponding to q=4 memory cell levels $l_1$ to $l_4$ at each of the N symbol positions in an ordered codeword $X^o$. The ordered component set $R_n$, n=1 to N, defined by each row vector of matric $Y^s$ is partitioned into subsets $r_m$, m=0 to q−1, of size about $p_{nm}*B$ (i.e. the subset size is as close as possible to $p_{nm}*B$ subject to rounding to integer values). Thus, the size of the first subset in each ordered component set $R_n$ depends on the probability of occurrence of the symbol value q=0, corresponding to memory cell level $l_1$, at component position n in an ordered codeword $X^o$. The size of the second subset in each component set $R_n$ depends on the probability of occurrence of the symbol value q=1, corresponding to memory cell level $l_2$, at component position n in an ordered codeword $X^o$, and so on. The correspondence between subsets and probability matrix elements is indicated by arrows in the figure for selected subsets. The resulting correspondence between subsets $r_m$ and memory cell levels $l_q$ (corresponding to columns of probability matrix P) is indicated by corresponding shading in FIG. 4. It will be seen that, depending on the probability values, each ordered component set $R_n$ is partitioned into up to q=4 subsets corresponding to respective memory cell levels $l_1$ to $l_4$. If the probability of occurrence of the symbol value for any memory cell level is zero at a given component position n, there will be no subset corresponding to that memory cell in the corresponding row of $Y^s$. This is the case for component positions n=1 and n=N in the example shown, where ordered component sets $R_1$ and $R_N$ are each partitioned into only three subsets.

After partitioning the ordered component sets into subsets, an estimate of the drifted levels $\lambda_1$ to $\lambda_q$ for the current batch of codewords can be obtained from the signal components in the subsets corresponding to each memory cell level $l_1$ to $l_q$. In particular, in step 14 of FIG. 2, the current reference signal level $\lambda$ for a given memory cell level l is obtained by averaging the components $y_{ni}^{sr}$ in the subsets corresponding to that memory cell level:

$$\lambda_j = E\{y_{ni}^{sr}\} \text{ for } y_{ni}^{sr} \in \text{ a subset corresponding to } l_j,$$

where: E denotes the mean value; j=1 to q; n=1 to N; and i=1 to B. In the example of FIG. 4, therefore, the shaded groups of components corresponding to respective memory cell levels $l_1$ to $l_4$ are averaged to determine the current set of reference levels $\lambda_1$ to $\lambda_4$.

In general, the predefined probabilities used in partitioning step 13 might be calculated in various ways, based on the overall set of codewords and how likely each particular codeword is to appear (e.g. expressed in terms of codeword probabilities) in use of the code. A particular example will be described for a preferred embodiment where the overall codeword set employed in encoder 3 comprises a union of permutation codes. In this case, each codeword of the codeword set is a permutation of an N-symbol vector, of a predefined set of N-symbol vectors, whose symbols are ordered according to symbol value. These vectors are the so-called "initial vectors" of the constituent permutation codes. FIG. 5 illustrates the construction of such a code with q=4 and N=7. The code is based on the union of four permutation codes with initial vectors $c^{(k)}$, k=1 to 4, shown in the figure. There are 2100 codewords, consisting of a number of permutations of each initial vector as indicated by $\#\Pi(c^{(k)})$. Assuming all codewords are equally likely, then the probabilities defining the probability matrix P described above depend on the symbol values in the initial vectors and the number $\#\Pi(c^{(j)})$ of codewords which are permutations of each vector. In FIG. 5, $c^{(1)}$ is an example of $c^{(j)}$ initial vectors and is depicted as [0112233] with corresponding $\Pi(c^{(1)})$ as 630; similarly $c^{(2)}$ is depicted as [0011223] with corresponding $\Pi(c^{(2)})$ as 630; $c^{(3)}$ is depicted as [0001233] with corresponding $\Pi(c^{(3)})$ as 420; and $c^{(4)}$ is depicted as [0012333] with corresponding $\Pi(c^{(3)})$ as 420. In particular, the probabilities $p_k$ of occurrence of the initial vectors $c^{(k)}$ can be easily calculated as:

$$p_1 = p_2 = 63/210;$$

$$p_3 = p_4 = 42/210.$$

These probabilities $p_1$ to $p_4$ can then be used to calculate elements of probability matrix P by considering the symbol values at each symbol position in the initial vectors. For example, element $p_{11}$ of P can be determined as $p_{11} = (p_1+p_2+p_3+p_4) = 1$, whereby element $p_{12} = p_{13} = p_{14} = 0$. Element $p_{21}$ of P can be determined as $p_{21} = (p_2+p_3+p_4)$. Element $p_{22} = p_1$; element $p_{23} = p_{24} = 0$; and so on. While use of such permutation codes simplifies calculation of the probability matrix P, in general the required probabilities can be calculated in any desired manner for use in the level estimation process.

The reference levels $\lambda_1$ to $\lambda_q$ calculated from the read signals for a group of codewords are used in step 15 of FIG. 3 to detect the codewords corresponding to those read signals. Detection of codewords based on the reference levels $\lambda_1$ to $\lambda_q$ can be performed in a variety of ways. In a simplistic implementation, for example, the reference levels $\lambda_1$ to $\lambda_q$ could be used directly for codeword detection by comparing the components $y_n$ of each read signal y with these levels to identify the particular cell level, and hence symbol value, to which each read signal component corresponds. In other embodiments, however, the codeword detector may perform one or more stages of codeword detection using a technique such as MAP (maximum-a-posteriori) or ML (maximum-likelihood) decoding. For example, in preferred embodiments using permutation codes in encoder 3, the detection process may employ such techniques to cluster ordered read signals about vector signals obtained from respective initial vectors by replacing each symbol of each initial vector by the current reference signal level $\lambda$ corresponding to that symbol value. The codeword corresponding to an ordered read signal clustered about a vector signal corresponding to a given initial vector can then be obtained by applying to that initial vector the inverse of the permutation performed in producing the ordered read signal from the original, unordered read signal. Particular examples of such detection processes are detailed in our copending patent applications referenced above, the relevant content of which is incorporated herein by reference. In general, however, any desired detection technique can be employed based on the reference levels determined by level estimator 6, and suitable implementations for codeword detector 7 will be readily apparent to those skilled in the art.

Figure 6:
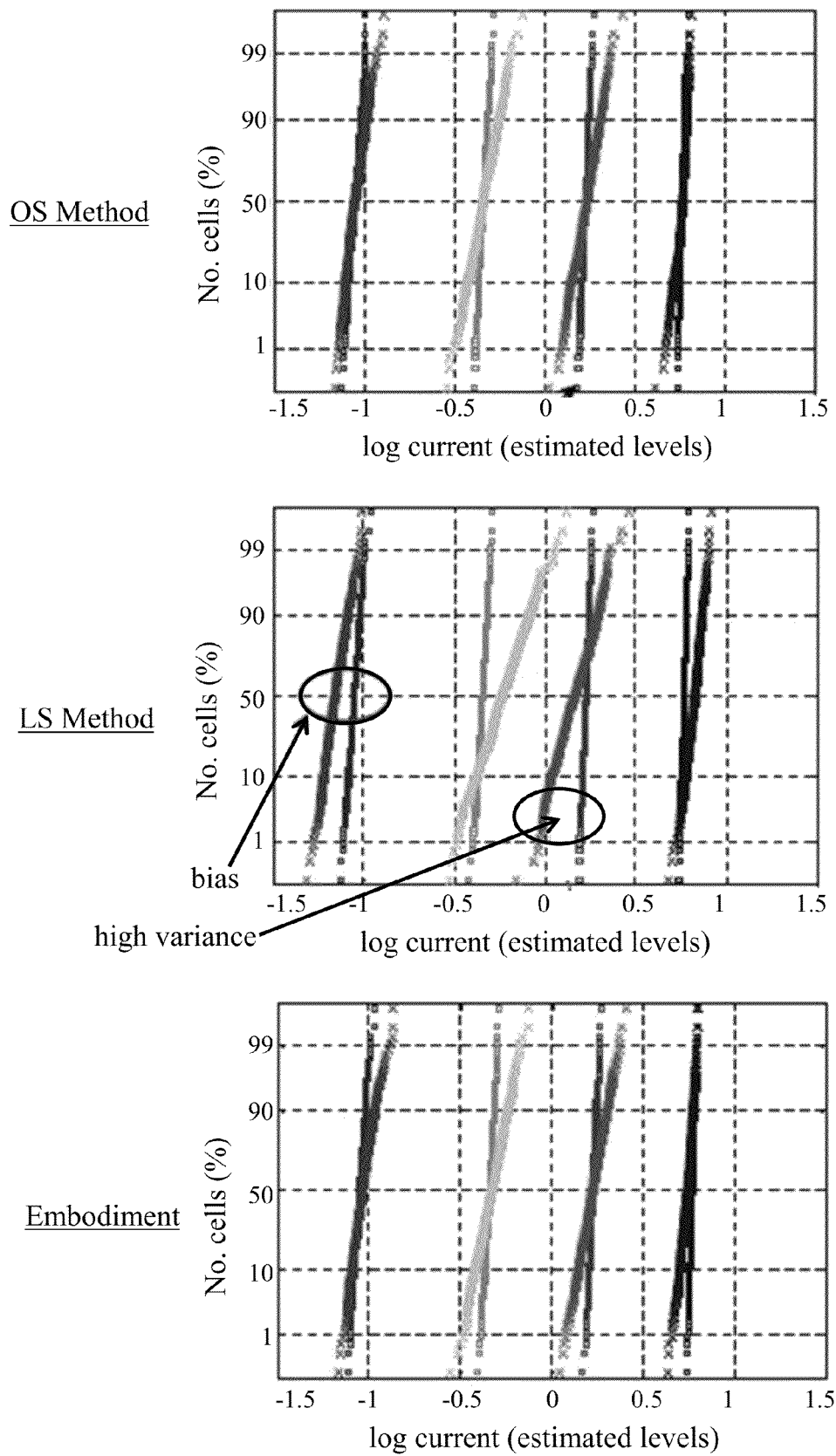
FIG. 6 compares performance of the level estimation process of FIG. 2 with two previously-proposed techniques.

The level estimation process described above provides significant advantages in operation of MLC memory devices. Complexity and latency are substantially reduced compared to the technique of our above-referenced UK patent application, while performance is significantly improved compared to the technique our above-referenced international patent application. FIG. 6 compares performance of an embodiment of the invention with the two prior techniques. This figure shows cumulative distribution plots for estimated levels obtained with the three techniques based on simulations using parameters extracted from experimental data. The illustrated results were obtained for q=4-level cells storing $4^{ary}$ symbols of an N=8 SPC (single parity check) code, of rate 1.875, with a batch (codeword group) size of B=32. The cumulative distribution plot for each level estimation technique was obtained from 100,000 cells, read in batches storing B=32 codewords, with the appropriate technique used to calculate estimated levels for the four memory cell levels from each batch. Each plot shows the cumulative distribution of the resulting estimated levels $\lambda$, at time $t=10^7$ s after recording, as percentage of cells versus estimated level value (expressed as logarithm of read current level). The corresponding level distributions for estimates calculated using a genie (i.e. assuming perfect knowledge of all user cells) are also shown for each level in the plots, the genie-based distributions being the more vertical of the pair of distributions for each level. The upper plot in FIG. 6 (labelled "OS Method") plots "log current (estimated levels) on the X-axis using −1.5, −1, −0.5, 0, 0.5, 1, and 1.5 marked values versus No. cell (%) on the Y-axis using 1, 10, 50, 90, 99 marked values, and shows the results for the technique of our above-referenced UK application. The middle plot ("LS Method") plots "log current (estimated levels) on the X-axis using −1.5, −1, −0.5, 0, 0.5, 1, and 1.5 marked values versus No. cell (%) on the Y-axis using 1, 10, 50, 90, 99 marked values, and shows the results for the technique our above-referenced international application. The lower plot ("Embodiment") plots "log current (estimated levels) on the X-axis using −1.5, −1, −0.5, 0, 0.5, 1, and 1.5 marked values versus No. cell (%) on the Y-axis using 1, 10, 50, 90, 99 marked values, and shows the results for the level estimation process of FIG. 2. It can be seen that the level estimation technique embodying the invention matches performance of the OS Method, giving distributions with similarly low variance (corresponding to high slope) and low bias (good concentration around the mean (50%) point). In contrast, the distributions for the LS Method show higher variance (lower slopes) and greater bias as indicated in the figure.

Figures 7, 8:
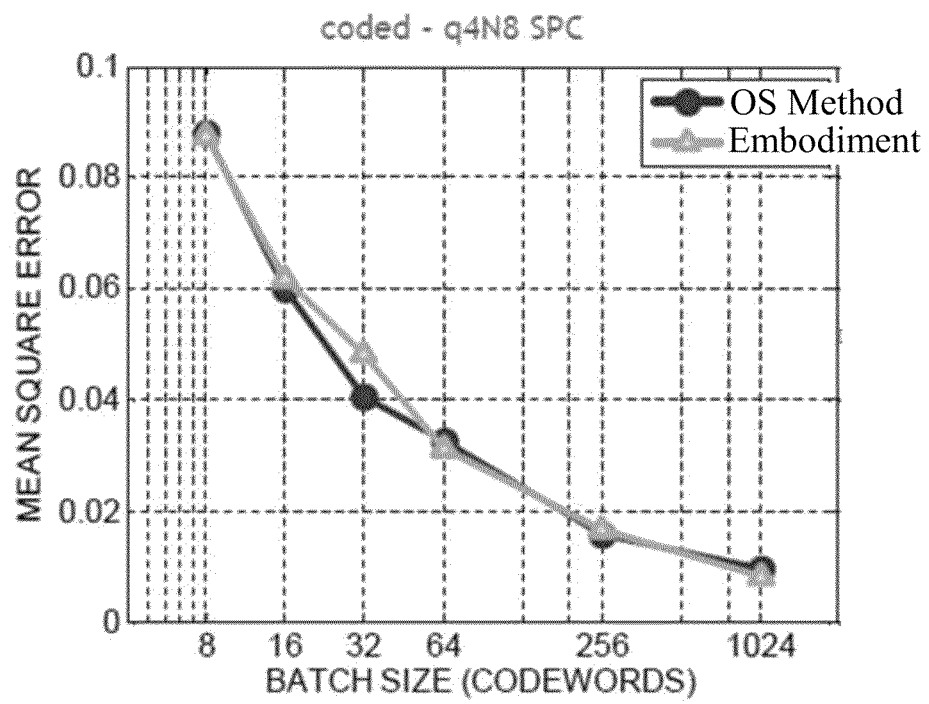
FIG. 7 compares performance of the level estimation process of FIG. 2 with a previously-proposed technique.
FIG. 8 indicates complexity reductions obtained with the FIG. 2 process.

Good performance is also achieved with any code, even for very small data records, with the level estimation technique embodying the invention. By way of illustration, FIG. 7 compares performance of the technique embodying the invention (trace labelled "Embodiment") with performance of the OS Method for the q=4, N=8, SPC code. The figure plots the mean square error (i.e. mean square difference between the estimated reference level λ for a memory cell level l and actual value of the reference level corresponding to that level l) against batch size B for the two methods. The depicted graph plots "batch size (codewords) on the X-axis using 8, 16, 32, 64, 256, and 1024 marked values versus mean square error on the Y-axis using 0, 0.02, 0.04, 0.06, 0.08, and 0.1 marked values. It can be seen that the technique embodying the invention matches performance of the prior technique even for small batch sizes. Complexity, however, is dramatically reduced compared to the OS Method which requires sorting of a "long" vector of B*N elements, giving complexity $O\{B*N*\log(B*N)\}=B*N*O\{\log(B*N)\}$. By contrast, the technique described above performs N sorting operations each of a B-element vector (the initial sorting of the N-component read signals being an integral part of the overall detection process encompassing the level estimation process here). This gives complexity $N*O\{B*\log B\}=B*N*O\{\log B\}$, and relative complexity of $O\{\log B\}/O\{\log B+\log N\}$ compared to the prior technique. The dramatic effect of this improvement is readily apparent from the table of FIG. 8. This gives particular examples of the percentage complexity reduction achieved for an N=8 code with different batch sizes B, e.g., 16, 32, and 1024, showing complexity ratios 4/7, 5/8, and 10/13, respectively, and showing complexity reduction of 42.9%, 37.5%, and 23.1%, respectively. For typical memory applications where B is typically 16 or 32, an approximate 40% complexity reduction is achieved without sacrificing performance. For such applications, where latency is at a premium, this level of complexity reduction may prove enabling for MLC technology, whereas DRAM (dynamic random access memory), today's main-memory technology, provides only single-level cell operation with storage of only two levels per cell.

It will of course be appreciated that many changes and modifications can be made to the particular embodiments detailed above. For example, following the partitioning step of FIG. 4 above, the reference signal level for each of the q memory cell levels is determined from the corresponding subsets of the ordered component sequences. In other embodiments, however, the reference signal levels for only some of the q memory cell levels (e.g. two or more "outer" levels of the series of q memory cell levels) could be determined from the signal components in their corresponding subsets. The reference signal level for each other memory cell level (e.g. one or more "inner" cell levels) could then be obtained by interpolation from these initially-determined reference levels.

Other ways for calculating the reference signal levels from the subset components can also be envisaged. For example, an average value other a simple mean value, e.g. a median (middle value) or mode (most common value) might possibly be used. In addition, other functions, e.g. a weighted average or accommodating some desired correction factor, might be envisaged here.

While memory 2 uses PCM cells, the techniques described are generic and can be applied to any other multilevel memory cells, e.g. flash memory cells, for level estimation. Many other changes and modifications can be made to the above embodiments without departing from the scope of the invention.

The invention claimed is:

1. An apparatus for determining reference signal levels corresponding to respective levels of q-level memory cells, the cells storing respective symbols, each of which has one of q symbol values, of N-symbol codewords of a predefined codeword set, where q>2, the apparatus comprising:
   a memory controller for reading the memory cells storing a group of codewords to obtain respective read signals each comprising N signal components corresponding to respective symbols of a codeword; and
   a level estimator comprising a control logic adapted to:
   order the components of each read signal according to a signal level to produce an ordered read signal;
   order correspondingly-positioned components of the ordered read signals according to the signal level to produce ordered component sets for respective component positions in the ordered read signal;
   partition each ordered component set into subsets corresponding to the respective memory cell levels, wherein the subsets of the ordered component sets contain respective numbers of components dependent on predefined probabilities of occurrence of different symbol values at different positions in the codeword, wherein symbols of the codeword are ordered according to symbol values; and
   determine the reference signal level corresponding to a respective memory cell level in dependence on the signal components in the subsets corresponding to the memory cell level.

2. A data storage device comprising:
   memory having q-level memory cells, where q>2;
   write apparatus for writing in the memory N-symbol codewords of a predefined codeword set, the symbols of each codeword, each of which has one of q symbol values, being stored in respective memory cells; and
   read apparatus comprising apparatus as claimed in claim 1 for determining reference signal levels for respective memory cell levels from said read signals for a group of codewords, and a codeword detector for detecting the codeword corresponding to each of said read signals in dependence on said reference signal levels.

3. The device as claimed in claim 2, wherein the memory cells are phase change memory cells.

4. A method for determining reference signal levels corresponding to respective levels of q-level memory cells, the memory cells storing respective symbols, each of which has one of q symbol values, of N-symbol codewords of a predefined codeword set, where q>2, the method comprising:
   reading, using a hardware device, the memory cells storing a group of codewords to obtain respective read signals each comprising N signal components corresponding to respective symbols of a codeword;

ordering the components of each read signal according to a signal level to produce an ordered read signal;

ordering correspondingly-positioned components of the ordered read signals according to the signal level to produce ordered component sets for respective component positions in the ordered read signal;

partitioning each of the ordered component set into subsets corresponding to respective memory cell levels, wherein the subsets of the ordered component sets contain respective numbers of components dependent on pre-defined probabilities of occurrence of different symbol values at different positions in the codeword, wherein symbols of the codeword are ordered according to symbol values; and determining a reference signal level corresponding to a respective memory cell level in dependence on the signal components in the subsets corresponding to the memory cell level.

5. The method as claimed in claim 4 further comprising:

determining the reference signal level corresponding to each of the q-level memory cell levels in dependence on the signal components in the subsets corresponding to that memory cell level.

6. The method as claimed in claim 4 further comprising:

producing the ordered component set for each of the N component positions in a said ordered read signal.

7. The method of claim 4, further comprising:

determining the reference signal level corresponding to the respective memory cell level by calculating an average value of the signal components in the subsets corresponding to that memory cell level.

8. The method as claimed in claim 7 wherein the average value is a mean value.

9. The method of claim 4, wherein each codeword of the codeword set is a permutation of an N-symbol vector, of a predefined set of N-symbol vectors, which has $q^{ary}$ symbols ordered according to symbol values, and wherein said probabilities are dependent on the symbol values in said vectors and the number of codewords in the codeword set which are permutations of each vector.

10. The method of claim 4, further comprising:

detecting the codeword corresponding to each of the read signals in dependence on said reference signal levels.

* * * * *